(12) United States Patent
Lee

(10) Patent No.: US 7,414,375 B2
(45) Date of Patent: Aug. 19, 2008

(54) FAN VOLTAGE REGULATION CONTROL DEVICE

(75) Inventor: Tsung-Te Lee, Taipei Hsien (TW)

(73) Assignee: Zippy Technology Corp., Hsin-Tien, Taipei Hsien (TW)

( * ) Notice: Subject to any disclaimer, the term of this patent is extended or adjusted under 35 U.S.C. 154(b) by 24 days.

(21) Appl. No.: 11/581,588

(22) Filed: Oct. 17, 2006

(65) Prior Publication Data

US 2008/0088263 A1 Apr. 17, 2008

(51) Int. Cl.
H02P 7/00 (2006.01)
H02H 7/08 (2006.01)

(52) U.S. Cl. ............... 318/268; 318/471; 318/434; 388/903; 388/934

(58) Field of Classification Search .......... 318/471, 318/504, 434, 268
See application file for complete search history.

(56) References Cited

U.S. PATENT DOCUMENTS 5,068,777 A * 11/1991 Ito .................... 363/97
6,291,956 B1 * 9/2001 Ku ..................... 318/445
6,703,803 B2 * 3/2004 Ohiwa et al. ........ 318/400.17
7,038,415 B2 * 5/2006 Nakamura et al. ...... 318/471
7,091,689 B2 * 8/2006 Lee ................. 318/400.21
7,184,654 B2 * 2/2007 Kanamori et al. ...... 318/400.04
7,256,562 B2 * 8/2007 Lee .................... 318/268

FOREIGN PATENT DOCUMENTS

| TW | 420326 A | 1/2001 |
|---|---|---|
| TW | 527090 A | 4/2003 |
| TW | 545624 A | 8/2003 |
| TW | M241884 U | 8/2004 |
| TW | M250225 U | 11/2004 |

* cited by examiner

Primary Examiner—Lincoln Donovan
Assistant Examiner—Thai Dinh
(74) Attorney, Agent, or Firm—Muncy, Geissler, Olds & Lowe, PLLC

(57) ABSTRACT

A fan voltage regulation control device includes a voltage regulation control unit for providing the power to a heat-dispersing fan, wherein the voltage regulation control unit is connected to a temperature detecting element and a voltage detecting unit. The temperature detecting element may influence the output power from the control unit to the fan, and through the voltage detecting unit, an input current to the fan can be maintained for providing overload and overheated protections.

6 Claims, 5 Drawing Sheets

| temperature(T) | voltage(V) | fan rotation speed(rpm) |
|---|---|---|
| t1 | v1 | first rotation speed |
| t2 | v2 | second rotation speed |
| t3 | v3 | third rotation speed |

Fig. 4

FAN VOLTAGE REGULATION CONTROL DEVICE

FIELD OF THE INVENTION

The present invention is related to a fan voltage regulation control device, and more particularly to a fan voltage regulation control device which adopts a voltage detecting unit for maintaining an input current constant and also providing overload and overheated protections.

BACKGROUND OF THE INVENTION

Heat consumption always happens in electronic products, and the scale of heat consumption of electronic element influences the heat dispersal inside the electronic product. However, since the size of electronic product is getting smaller owing to the technology development, a better heat-dispersing device must be used. Therefore, the design of the control device for the heat-dispensing fan which is installed in the electronic product has become an importance in the industry. Furthermore, because the modern electronic product requests more efficient heat dispersion, the control circuit of the heat-dispersing fan also relatively demands a better efficiency. Thus, the design of the voltage regulating control circuit for the heat-dispensing fan also means a lot in the industry.

The methods for controlling the heat dispersion of the electronic device can be divided into manual-control mode and auto-control mode. References to the manual-control mode are as disclosed in R.O.C. Patent Publication Nos. 527090, 545624 etc., and references to the auto-control mode are as disclosed in R.O.C. Patent Publication No. 420326, R.O.C. Patent Nos. M241884, M250225 etc. However, no matter the auto-control or the manual-control mode, both can be concluded as FIGS. 1 and 2. Currently, the proposed control modes are mainly achieved by utilizing a temperature sensing element, such as thermistor, to constantly detect the temperature coefficient of the environment inside the electronic device as the electronic device is operated, and then changing the driving electricity inputted to the heat-dispersing fan by altering the impedance of the temperature sensing element or altering the wire resistance in the shunt circuit according to the coefficient variation. As shown in FIG. 1, the rotation speed and the temperature have a linear relationship, but this kind of control mode still might cause an unstable voltage supply. Generally, the heat-dispersing fan of a power supplier not only provides the heat-dispersing function for the electronic element inside the power supplier, but also has to exhaust the heat produced by other electronic devices in the computer (such as CPU, hard disk etc.). Therefore, the position of the power supplier and the quantity or position of other electronic devices will influence the direction and temperature of the wind guided by the heat-dispersing fan, the noise caused by wind shearing, and also the efficiency of heat-dispersion. Furthermore, owing to the influence of temperature rising, falling and current variation, the temperature sensing element might have problems of heat consumption and material carbonation which may cause the current hard to control.

Besides, the position of the temperature sensing element and the heat current direction inside the casing are also important. The relationship therebetween may influence the supplied current to the heat-dispersing fan so as to indirectly cause the rotation speed thereof unstable and therefore a rotation noise. Currently, for most computer products, such as personal computer, server computer, or barebone computer, the advantage thereof is quiet as operating. However, if the heat-dispersing fan has an unstable current input or fluctuant power input, the rotation of the fan may be influenced to generate shearing noise; or if the current transiently rises or falls, the rotation speed may have a transient which also causes the noise. Therefore, the voltage control of heat-dispersing fan in the prior art is unstable and still can be improved.

SUMMARY OF THE INVENTION

The object of the present invention is to solve the problems described above. The present invention provides a fan voltage regulation control device, wherein through a voltage regulation control unit, a voltage fluctuation of input power source can be tolerated for outputting a stable voltage continuously to the fan so as to maintain the rotation speed. Moreover, a temperature detecting element is further provided to obtain an environmental temperature coefficient for controlling the rotation speed. Furthermore, a voltage control unit is further provided to detect the output voltage for obtaining a reference voltage so as to regulate the voltage.

Another object of the present invention is to provide a fan voltage regulation control device, wherein the voltage regulation control unit is connected to a voltage detecting unit for adjusting the output voltage according to the reference voltage so as to maintain a stable output voltage and for providing a protection function when the output voltage exceeds a maximum loading.

Another further object of the present invention is to provide a fan voltage regulation control device, wherein the voltage regulation control unit is connected to the temperature detecting element which is different from the conventional technology, in which the temperature detecting element is directly serial connected to the output circuit, so that the problems of heat consumption and carbonation will not directly influence the current output which may cause a variation of rotation speed.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein:

FIG. 4 is a comparison list of fan rotation speed of the present invention; and

DESCRIPTION OF THE PREFERRED EMBODIMENT

Figure 1:
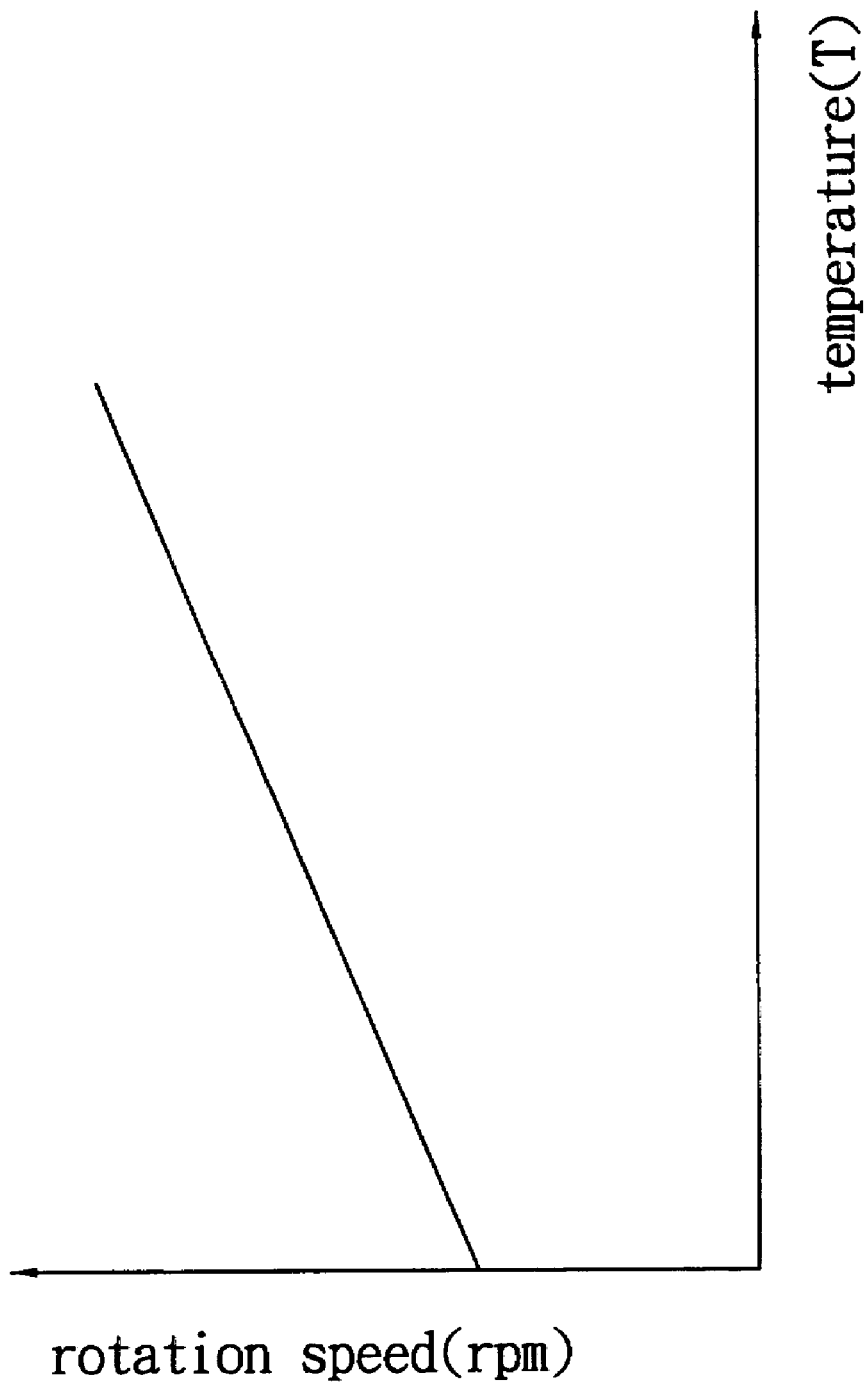
FIG. 1 is a graph showing the rotation speed variation depending on temperature of the conventional heat-dispersing fan.
Figure 2:
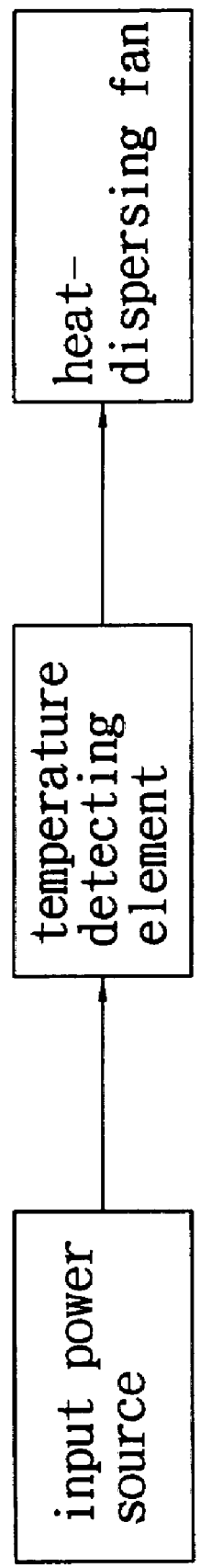
FIG. 2 is a block diagram of the control circuit for the conventional heat-dispersing fan.
Figure 3:
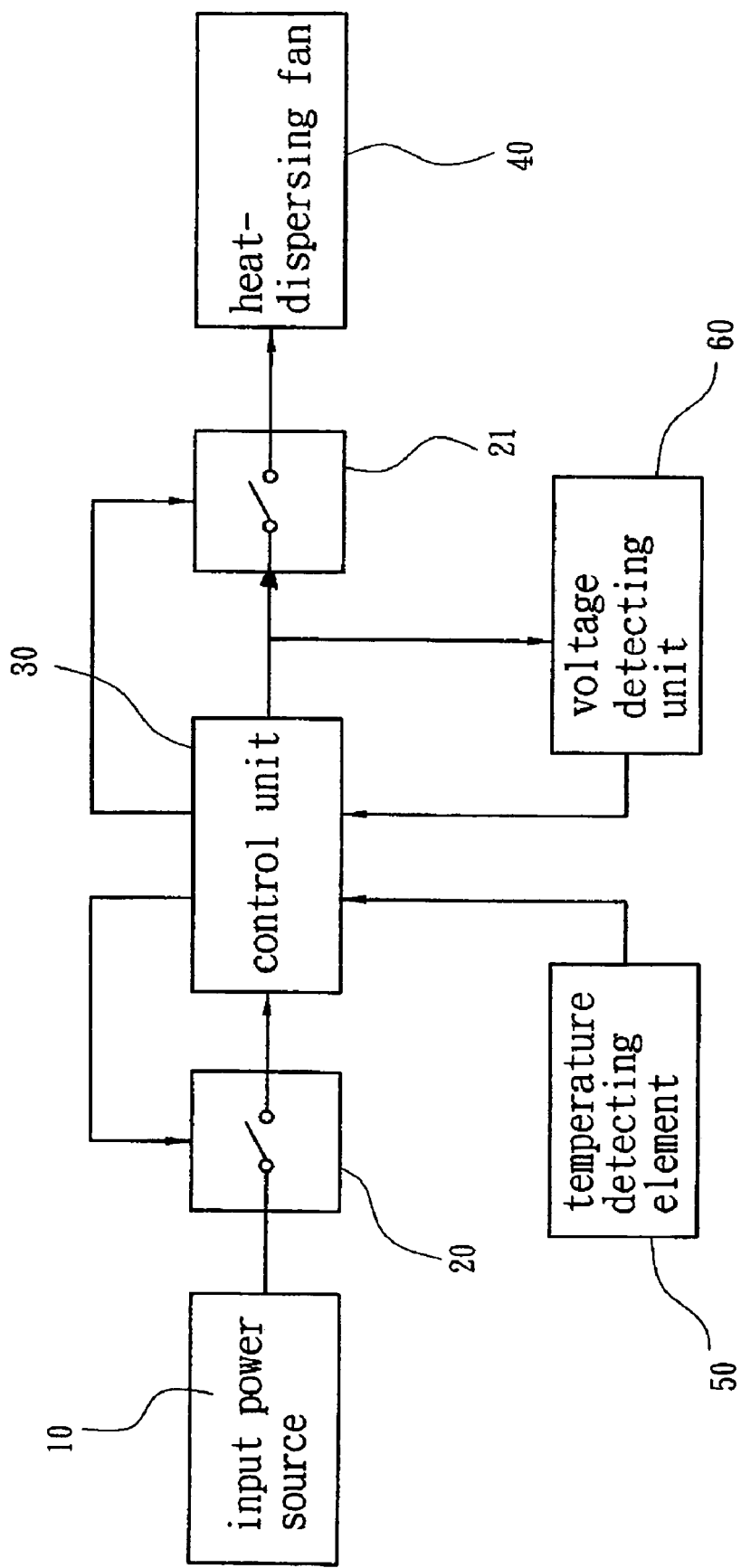
FIG. 3 is a block diagram showing a fan voltage regulation control device according to the present invention.

Please refer to FIG. 3, which is a block diagram of a fan voltage regulation control device according to the present invention. The fan voltage regulation control device is applied to a heat-dispersing fan 40 for stabling an output voltage so as to achieve a stable rotation speed of the heat-dispersing fan 40. In a preferred embodiment, the control device includes an input power source 10 which can be a DC voltage; a voltage regulation control unit 30 which is electrically connected between the input power source 10 and the heat-dispersing fan 40 and which can receive a rotation speed parameter and convert an input voltage into a stable output voltage to the heat-dispersing fan 40 for stabilizing the rotation speed of the fan 40; and a temperature detecting element 50 connected to the voltage regulation control unit 30 for providing a rotation speed parameter, wherein the rotation speed parameter can be an environmental temperature coefficient. The voltage regulation control unit 30 can be further connected to a voltage detecting unit 60 at a voltage output terminal thereof for detecting the voltage state so as to obtain a reference voltage; and the voltage regulation control unit 30 can be connected between the power source 10 and the heat-dispersing fan 40 with a first protecting switch 20 and a second protecting switch 21 respectively mounted at two ends of the control unit 30 so that the control unit 30 can send out protection signals to the first and the second switches 20, 21 for opening thereof.

As shown in FIG. 3, as operating, the input power source 10 can be a DC power source, the voltage regulation control unit 30 can tolerate a voltage fluctuation of the DC power source so as to maintain a stable output voltage to the fan 40, the voltage detecting unit 60 is connected to the voltage regulation control unit 30 and the voltage output terminal thereof for detecting the output voltage, and the temperature detecting element 50 is connected to the voltage regulation control unit 30 for obtaining the environmental temperature coefficient and outputting thereof to the voltage regulation control unit 30 so as to control the rotation of the fan 40.

Figure 5:
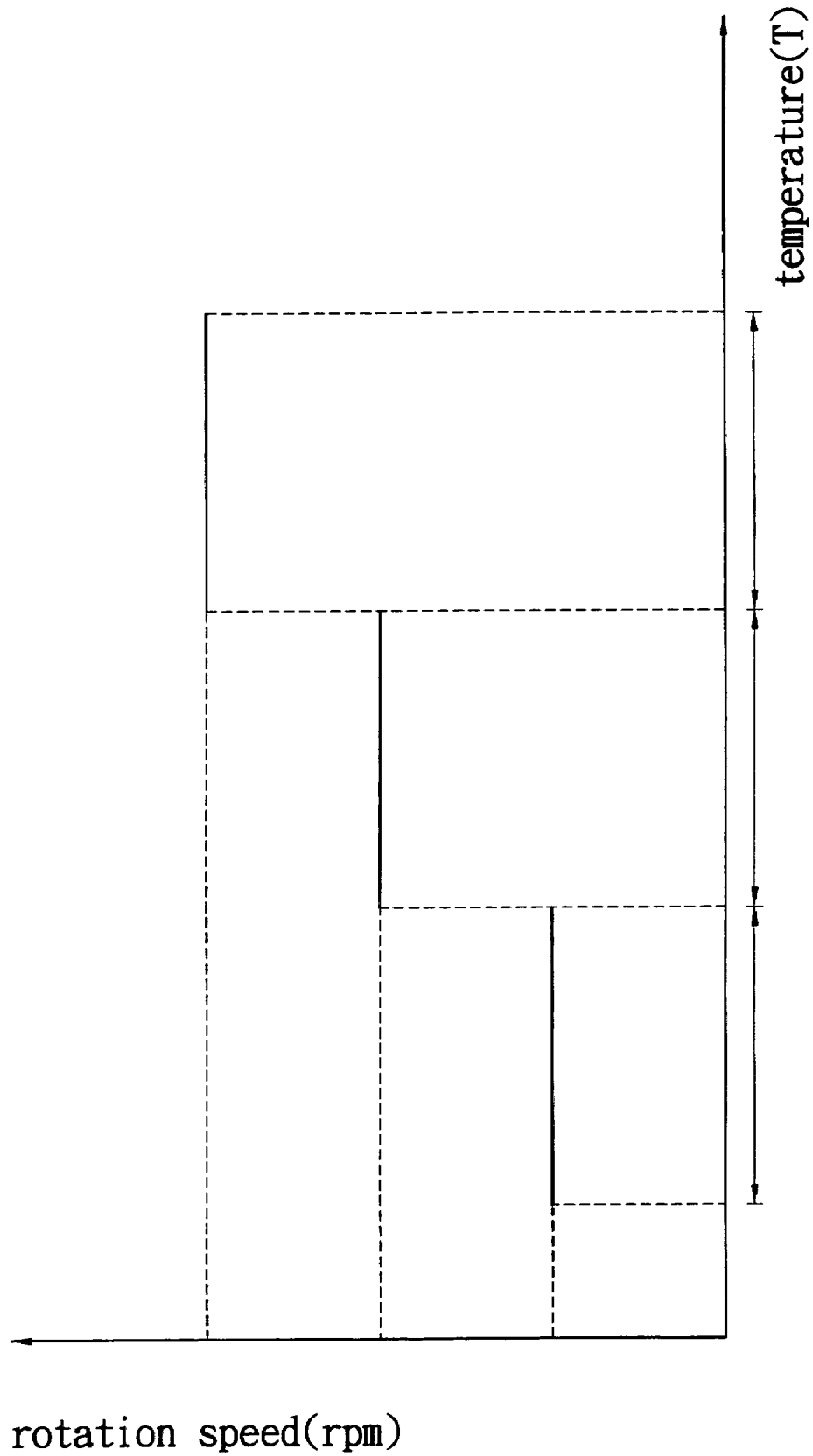
FIG. 5 is a graph showing the rotation speed variation depending on temperature of the fan in FIG. 3.

As shown in FIGS. 4 and 5, which take environmental temperature coefficient as an example, according to the using stages, the temperature variation can be defined as ranges t1, t2, and t3. The temperature detecting element 50 can send out a rotation speed parameter to the voltage regulation control unit 30, and the control unit 30 will output corresponding voltages V1, V2, and V3 in accordance with a comparison list for the rotation speed.

In a preferred embodiment, when the power input from the input power source 10 exceeds the limit, the voltage regulation control unit 30 may send out a protection signal to the first protecting switch 20 for opening thereof so as to protect the control unit 30.

In another preferred embodiment, when the output stable voltage exceeds the loading of the fan 40, the voltage regulation control unit 30 may send out a protection signal to the second protecting switch 21 for opening thereof so as to protect the fan 40.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A fan voltage regulation control device for stabilizing voltage and determining a rotation speed of a heat-dispersing fan, comprising:
   an input power source, which can provide an input voltage;
   a heat-dispersing fan;
   a voltage regulation control unit, which is electrically connected between the input power source and the heat-dispersing fan for receiving a rotation speed parameter and a reference voltage, and which comprises a voltage regulation element for converting the input power into a stable output voltage to the heat-dispersing fan so as to stabilize the rotation speed of the fan;
   a temperature detecting element directly electrically connected to the voltage regulation control unit for providing a rotation speed parameter, which is an environmental temperature coefficient; and
   a voltage detecting unit connected to the voltage regulation control unit for providing a reference voltage to the voltage regulation control unit.

2. The control device as claimed in claim 1, wherein the voltage detecting unit is further connected to a voltage output terminal of the voltage regulation control unit for detecting a voltage state so as to obtain the reference voltage.

3. The control device as claimed in claim 1, wherein the voltage regulation control unit is connected between the input power source and the heat-dispersing fan with a first protecting switch and a second protecting switch respectively mounted at two ends thereof, and, the voltage regulation control unit sends out protection signals for opening the switches.

4. The control device as claimed in claim 3, wherein when the input power exceeds the power source, the voltage regulation control unit sends out a protection signal.

5. The control device as claimed in claim 3, wherein when the stable output voltage exceeds the loading of the fan, the voltage regulation control unit sends out a protection signal.

6. The control device as claimed in claim 1, wherein the stable output voltage of the voltage regulation control unit is determined by the rotation speed parameter.

* * * * *